(12) United States Patent
Suh

(10) Patent No.: US 8,378,504 B2
(45) Date of Patent: Feb. 19, 2013

(54) MICROELECTRONIC PACKAGE WITH SELF-HEATING INTERCONNECT

(75) Inventor: Daewoong Suh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 818 days.

(21) Appl. No.: 12/165,465

(22) Filed: Jun. 30, 2008

(65) Prior Publication Data
US 2009/0321962 A1    Dec. 31, 2009

(51) Int. Cl.
*H01L 23/492* (2006.01)
*H01L 21/60* (2006.01)

(52) U.S. Cl. ......... 257/779; 257/E21.508; 257/E21.511; 257/E23.026; 257/E23.081; 438/125

(58) Field of Classification Search .................. 257/738, 257/772, 779–781, 633, 634, 641, 650, 794; 438/723, 743, FOR. 373, FOR. 383
See application file for complete search history.

(56) References Cited

U.S. PATENT DOCUMENTS

| | | | | |
|---|---|---|---|---|
| 3,718,608 | A * | 2/1973 | Mason et al. | 252/514 |
| 5,903,058 | A * | 5/1999 | Akram | 257/778 |
| 6,221,751 | B1 * | 4/2001 | Chen et al. | 438/612 |
| 6,273,322 | B1 * | 8/2001 | Yamamoto et al. | 228/110.1 |
| 6,514,453 | B2 * | 2/2003 | Vigliotti et al. | 264/618 |
| 2009/0032970 | A1 * | 2/2009 | Park et al. | 257/777 |
| 2009/0079093 | A1 * | 3/2009 | Moran et al. | 257/778 |

* cited by examiner

*Primary Examiner* — David Vu
*Assistant Examiner* — Jonathan Han
(74) *Attorney, Agent, or Firm* — Winkle, PLLC

(57) ABSTRACT

A microelectronic package is provided. The microelectronic package includes a substrate having a plurality of solder bumps disposed on a top side of the substrate and a die disposed adjacent to the top side of the substrate. The die includes a plurality of glassy metal bumps disposed on a bottom side of the die wherein the plurality of glassy metal bumps are to melt the plurality of solder bumps to form a liquid solder layer. The liquid solder layer is to attach the die with the substrate.

23 Claims, 6 Drawing Sheets

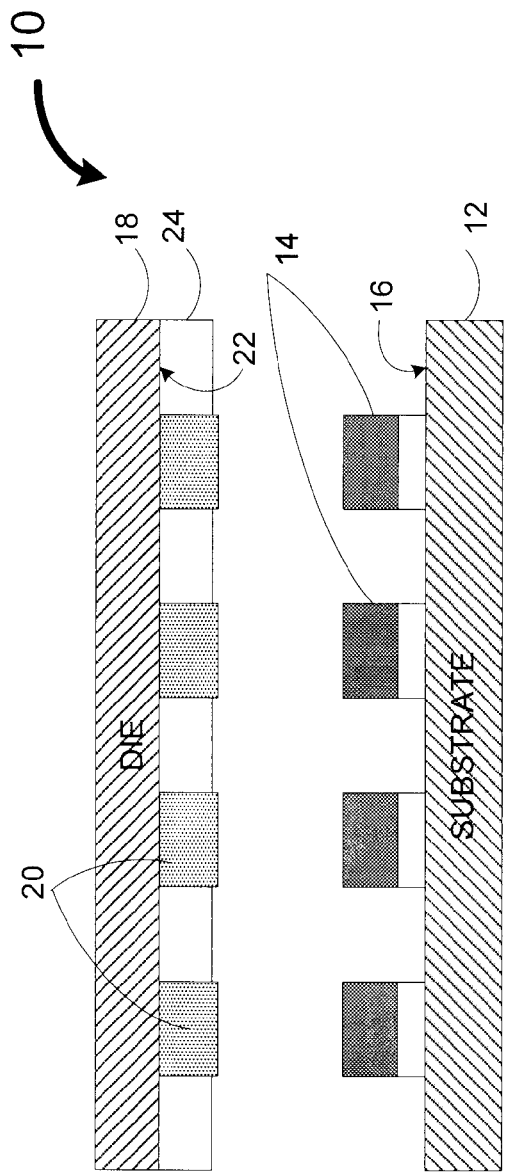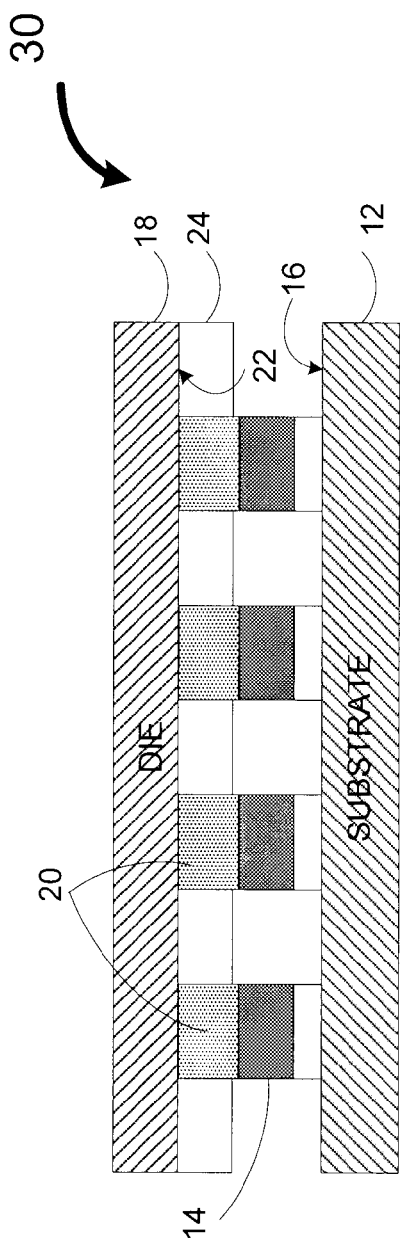

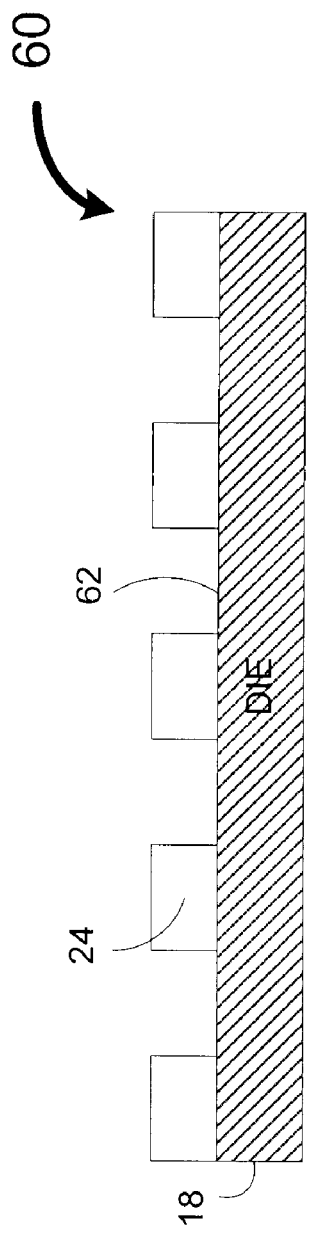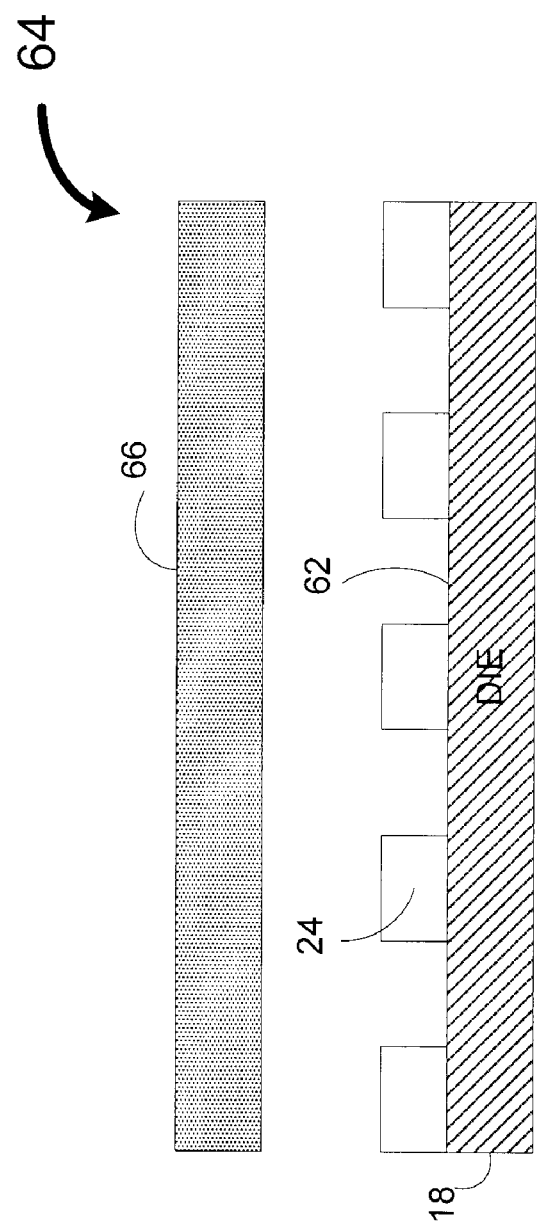

MICROELECTRONIC PACKAGE WITH SELF-HEATING INTERCONNECT

BACKGROUND

With recent advancements in semiconductor manufacturing technology microelectronic components are becoming smaller and circuitry within such components is becoming increasingly dense. This has led to an increase in wiring levels and a reduction in the wiring pitch to increase the wiring density. Many leading edge processors have multiple levels of high density interconnects.

In order to prepare microelectronic components such as a chip having a high speed, a conductor having a low resistance and a dielectric material having low dielectric constant is used. Typically, microelectronic components employ SiO2 as the interlayer dielectric material having the requisite mechanical and thermal properties.

One challenge is that the low dielectric constant (k) interlayer dielectric strength continues to decline as a result of reduced dielectric constant. Furthermore, the stress transferred to the low K interlayer dielectric continues to increase with lead free conversion and pitch reduction.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 1 illustrates an embodiment of a microelectronic package;

FIG. 2 illustrates an exemplary assembled configuration of the microelectronic package of FIG. 1;

FIGS. 4-7 illustrate exemplary steps for forming the plurality of glassy metal bumps of the microelectronic package of FIG. 1;

Figure 3:
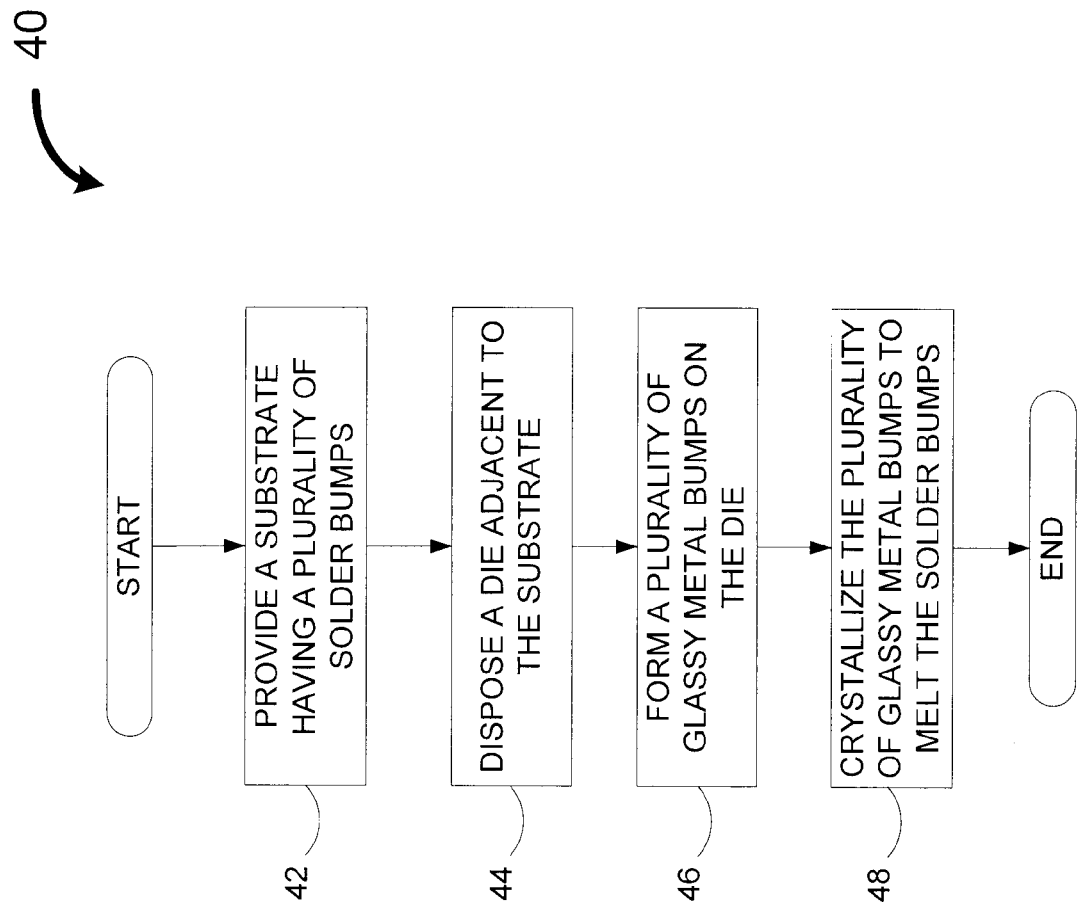
FIG. 3 illustrates an exemplary process of forming the microelectronic package of FIG. 1.
Figure 6:
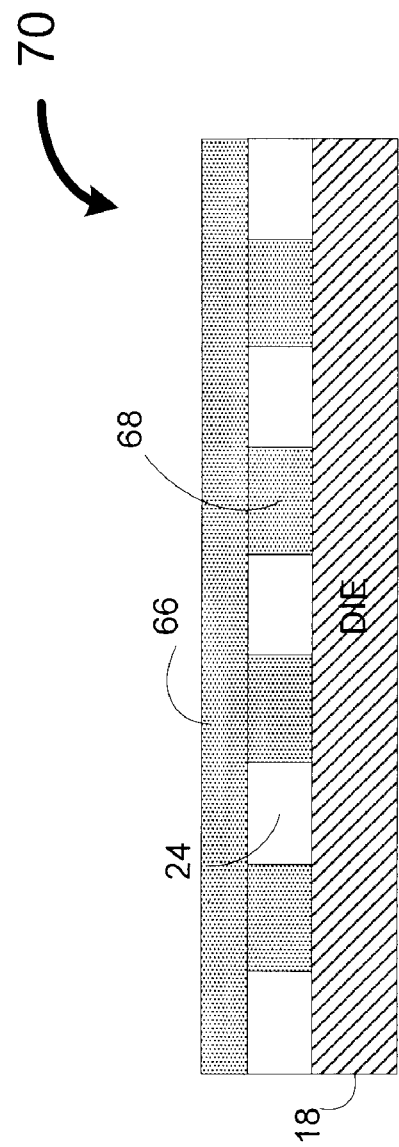

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

As discussed in detail below, the embodiments of the present invention function to provide a method of low temperature assembly of microelectronic package. In particular, the present technique employs a self-heating material that releases heat to facilitate attachment of components such as a die and a substrate of a microelectronic package.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The following description includes terms, such as top, bottom etc. that are used for descriptive purposes only and are not to be construed as limiting. The embodiments of the device or article described herein can be manufactured or used in a number of positions and orientations.

Referring first to FIG. 1, a microelectronic package 10 is illustrated. The microelectronic package 10 includes a substrate 12 having a plurality of solder bumps 14 disposed on a top side 16 of the substrate 12. The microelectronic package 10 also includes a die 18 disposed adjacent to the top side 16 of the substrate 12. The substrate 12 may be formed of a variety of materials including ceramic and printed circuit boards. Further, the substrate 12 may be a one-layer board or a multi-layer board. In certain embodiments, the die 18 forms one of a data storage device, a digital signal processor, a micro-controller and a hand-held device. The die 18 includes a plurality of glassy metal bumps 20 disposed on a bottom side 22 of the die 18. In the illustrated embodiment, the plurality of glassy metal bumps 20 are to melt the plurality of solder bumps 14 to form a liquid solder layer (not shown). Further, the liquid solder layer is to attach the die 18 with the substrate 12.

In the illustrated embodiment, the plurality of glassy metal bumps 20 are to generate heat through exothermic crystallization to melt the plurality of solder bumps 14 to form the liquid solder layer. In one embodiment, the die 18 is attached to the substrate 12 at a temperature greater than a glass transition temperature ($T_g$) of the plurality of glassy metal bumps 20 to enable the crystallization of the plurality of glassy metal bumps 20.

In one exemplary embodiment, each of the plurality of glassy metal bumps 20 comprises $Au_{49.2}Cu_{27}Ag_{5.5}Pd_{2.35}Si_{16}$. In another exemplary embodiment, each of the plurality of glassy metal bumps 20 comprises $Mg_{54}Cu_{28}Ag_7Y_{11}$. In yet another embodiment, each of the plurality of glassy metal bumps 20 comprises $La_{57.6}Al_{17.5}Cu_{12.45}Ni_{12.45}$. As will be appreciated by one skilled in the art a variety of other compositions may be envisaged for the plurality of glassy metal bumps 20.

The microelectronic package 10 also includes an insulating layer 24 disposed on the bottom side 22 of the die 18 between the plurality of glassy metal bumps 20. In certain embodiments, a wettable metal (not shown) is disposed on each of the plurality of glassy metal bumps 20. In one embodiment, the wettable metal includes copper. In another embodiment, the wettable metal includes nickel. In certain other embodiments, a noble metal (not shown) is disposed on the wettable metal. Examples of noble metal include, but are not limited to, silver and gold.

FIG. 2 illustrates an exemplary assembled configuration 30 of the microelectronic package 10 of FIG. 1. In the illustrated embodiment, the die 18 is attached to the substrate 12 at a temperature that is greater than the glass transition temperature of the plurality of glassy metal bumps 20. As a result, the plurality of glassy metal bumps 20 generate heat through exothermic crystallization that locally melts the plurality of solder bumps 14 which are in contact with the plurality of glassy metal bumps 20. Once all the heat is dissipated, the solder layer solidifies and a solder joint is formed between the die 18 and the substrate 12.

In one exemplary embodiment, the plurality of glassy metal bumps 20 comprise $Au_{49.2}Cu_{27}Ag_{5.5}Pd_{2.35}Si_{16}$ that has a glass transition temperature of about 128° C. In this exemplary embodiment, the die 18 is attached to the substrate 12 at a temperature between about 160° C. to about 170° C.

In another exemplary embodiment, the plurality of glassy metal bumps 20 comprise $Mg_{54}Cu_{28}Ag_7Y_{11}$ has a glass transition temperature of about 160° C. In this exemplary embodiment, the die 18 is attached to the substrate 12 at a temperature of about 210° C.

In yet another exemplary embodiment, the plurality of glassy metal bumps 20 comprise $La_{57.6}Al_{17.5}Cu_{12.45}Ni_{12.45}$ that has a glass transition temperature of about 150° C. In this exemplary embodiment, the die 18 is attached to the substrate 12 at a temperature of about 230° C.

It should be noted that the self-heating of the plurality of solder bumps achieved through exothermic crystallization of the plurality of glassy metal bumps 20 facilitates the bonding of the assembly at a relatively lower temperature as compared to the assembly without the plurality of glassy metal bumps 20. Further, the low temperature assembly reduces the stress on the microelectronic package 30.

FIG. 3 illustrates an exemplary process 40 for forming the microelectronic package 10 of FIG. 1. At block 42, a substrate having a plurality of solder bumps is provided. The plurality of solder bumps are disposed on a top side of the substrate. The plurality of solder bumps may be formed on the substrate using known techniques. For example, bumping processes such as paste printing or microball bumping may be used for forming the plurality of solder bumps. Further, a die is disposed adjacent to the top side of the substrate (block 44). At block 46, a plurality of glassy metal bumps are formed on a bottom side of the die. In this embodiment, each of the plurality of glassy metal bumps is to contact with a corresponding solder bump on the substrate.

Further, at block 48, the plurality of glassy metal bumps are crystallized to melt the plurality of solder bumps and to form a liquid solder layer. The liquid solder layer attaches the die with the substrate. As described before, the die is attached to the substrate at a temperature that is greater than a glass transition temperature of the plurality of glassy metal bumps to facilitate crystallization of the plurality of glassy metal bumps. The heat generated through exothermic crystallization of the plurality of glassy metal bumps locally melts the plurality of solder bumps to form the liquid solder layer. Once all the heat is dissipated, the solder layer solidifies and a solder joint is formed between the die and the substrate.

FIGS. 4-7 illustrate exemplary steps for forming the plurality of glassy metal bumps 20 of the microelectronic package 10 of FIG. 1. FIG. 4 illustrates an exemplary configuration 60 of the die 18 (see FIG. 1) having a patterned insulation layer 24 disposed on the die 18. In this embodiment, a photodefinable insulation material is patterned on a top side 62 the die 18.

As illustrated in configuration 64 of FIG. 5, a glassy metal 66 is imprinted onto the top side 62 of the die 18 under adequate pressure. In this exemplary embodiment, the glassy metal 66 is imprinted on the die at a temperature greater than the glass transition temperature of the glassy metal 66. As a result, the glassy metal undergoes superplastic deformation in the supercooled liquid region and fills patterns 68 on a master mold in highly conformal fashion, as illustrated in configuration 70 of FIG. 6.

Figure 7:
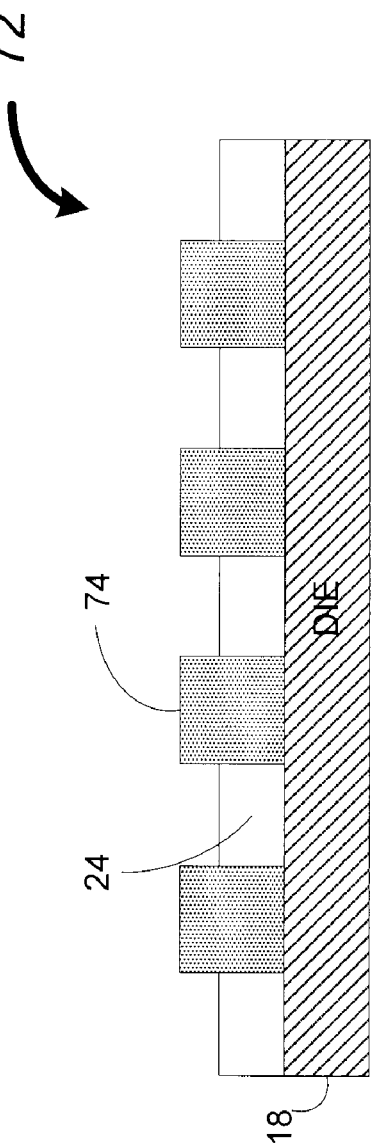

Further, as illustrated in exemplary configuration 72 of FIG. 7, chemical mechanical polish (CMP) may be employed to expose glassy metal bumps 74 above the insulation layer 24. In certain embodiments, the plurality of glassy metal bumps 74 may be formed by alternate processes. For example, photo resist patterning and etching may be employed to form the plurality of glassy metal bumps 74.

As discussed above, the plurality of glassy metal bumps 74 are heated to a temperature greater than a glass transition temperature of the glassy metal bumps to generate heat through exothermic crystallization. Further, the generated heat melts the plurality of solder bumps 14 (see FIG. 1) to form the liquid solder layer to attach the die with the substrate. It should be noted that based upon a composition of the glassy metal bumps 74, a heating temperature or an annealing time may be selected from a time-temperature-transformation (TTT) curve to induce crystallization of the plurality of glassy metal bumps 74.

Figures 8, 9:
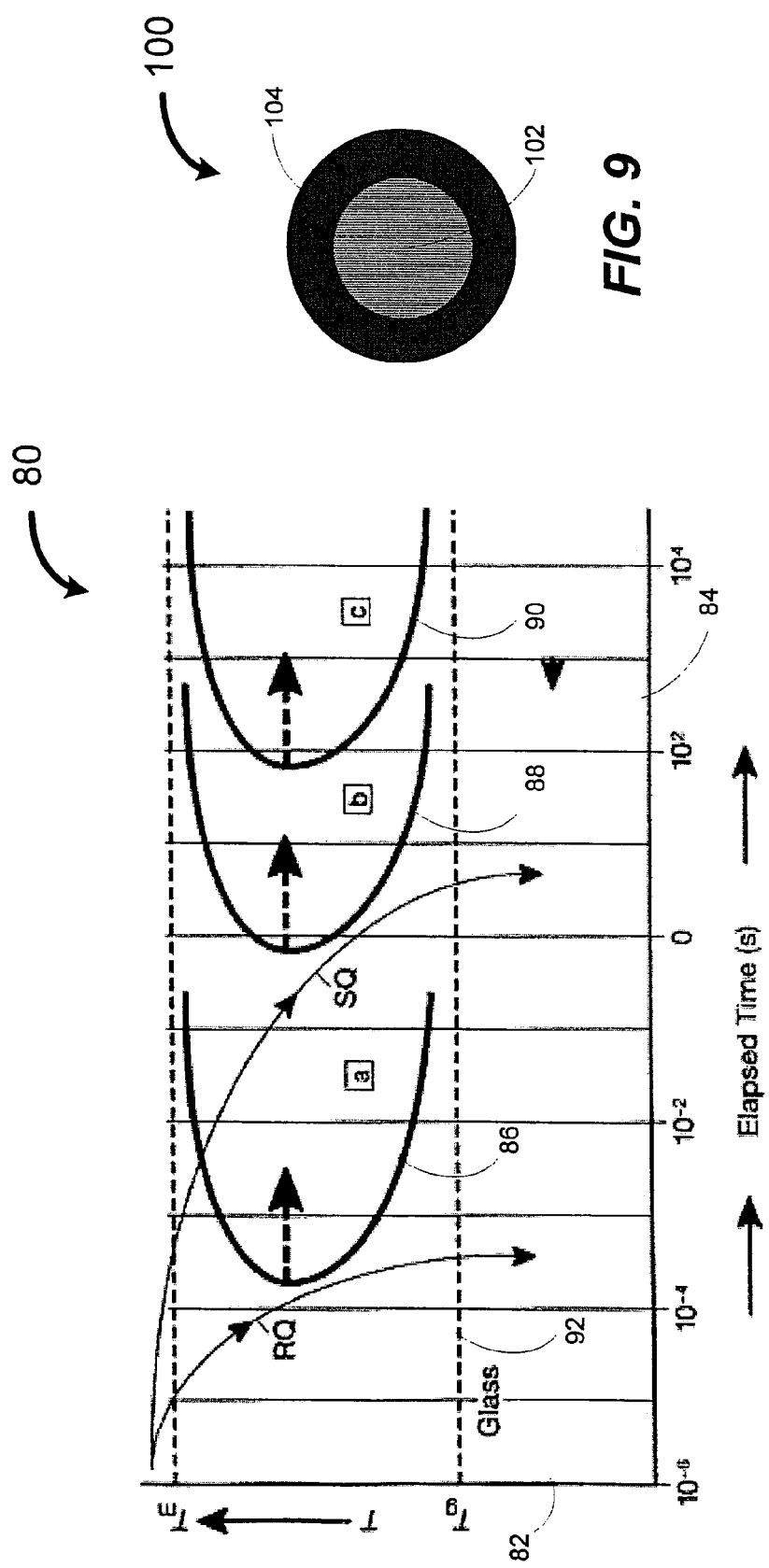
FIG. 8 illustrates an exemplary time-temperature-transformation curve of a glassy metal bump of FIG. 1.
FIG. 9 illustrates an exemplary configuration of a composite solder bump.

FIG. 8 illustrates an exemplary time-temperature-transformation curve 80 of a glassy metal bump 20 of FIG. 1. The ordinate axis 82 represents heating temperature and the abscissa axis 84 represents elapsed time. In the illustrated embodiment, exemplary curves 86, 88 and 90 represent time-temperature-transformation curves at different stages of crystallization of the glassy metal bump 20. Further, the glass transition temperature of the glassy metal bump 20 is represented by profile 92. The curves 86, 88 and 90 represent the time taken to achieve different stages of crystallization for a given isothermal temperature. As illustrated, the glassy metal 20 has a C-shaped time-temperature-transformation curve and has high stability against crystallization. As a result, it takes a relatively longer time and/or higher temperature to convert the glassy metal into crystals. As described before, the time-temperature-transformation curve may be used to select a temperature or an annealing time to induce crystallization of the glassy metal bump 20.

During crystallization at a temperature above the glass transition temperature 92 exothermic heat is generated. It should be noted that the amount of heat generated is dependent on a composition of the glassy metal bump 20. This generated heat facilitates melting of the solder bumps to attach the die with the substrate. As a result, the bonding is achieved at a much lower temperature as compared to conventional bonding using the plurality of solder bumps alone.

FIG. 9 illustrates an exemplary configuration 100 of a composite solder bump. The composite solder bump 100 comprises a glassy metal layer 102 and a solder layer 104 disposed about the glassy metal layer 102. In this exemplary embodiment, the composite solder bump 100 comprises a glassy metal sphere 102. Further, the solder layer 104 is electroplated around the glassy metal sphere 102 to form the composite solder bump 100. The composite solder bump 100 may be employed to attach the substrate 12 (see FIG. 1) with the die 18 (see FIG. 1) in the microelectronic package 10 of FIG. 1.

A plurality of composite solder bumps 100 may be disposed on the top side 16 (see FIG. 1) of the substrate 12. In operation, the plurality of solder bumps 100 may be heated at a temperature above the glass transition temperature of the glassy metal layer 102. This induces crystallization of the glassy metal layer 102 of each of the plurality of solder bumps 100 and melts the adjacent solder layer 104 to form a liquid solder layer. Once all the heat is dissipated, the solder layer solidifies and a solder joint is formed between the die 18 and the substrate 12.

Figure 10:
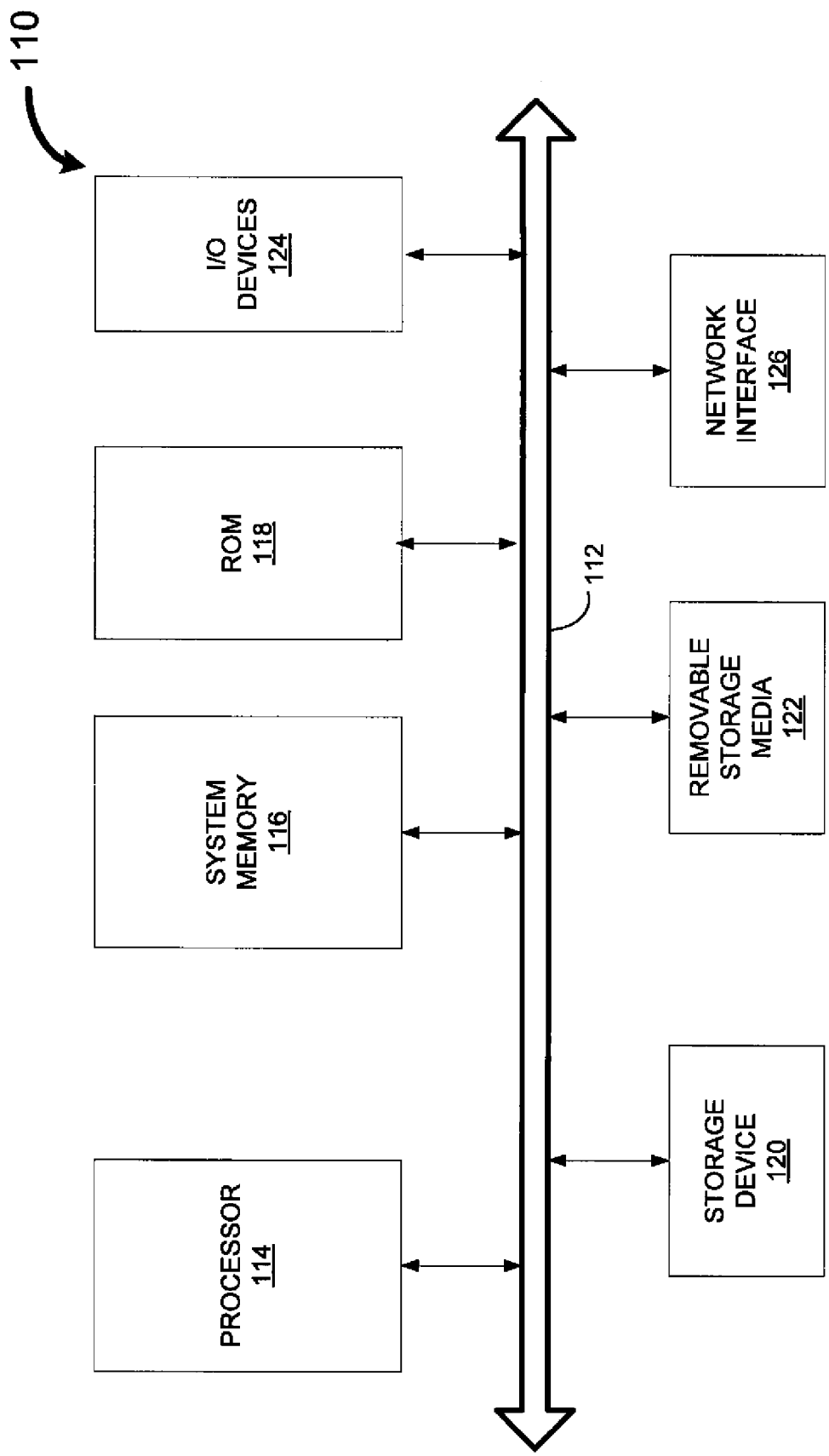
FIG. 10 illustrates an embodiment of a computer system.

The microelectronic package described above may be disposed in a computer system, a wireless communicator and a hand-held device. FIG. 10 illustrates an embodiment of a computer system 110. The computer system 110 includes a bus 112 to which the various components are coupled. In certain embodiments, the bus 112 includes a collection of a plurality of buses such as a system bus, a Peripheral Component Interface (PCI) bus, a Small Computer System Interface (SCSI) bus, etc. Representation of these buses as a single bus 112 is provided for ease of illustration, and it should be understood that the system 110 is not so limited. Those of ordinary skill in the art will appreciate that the computer system 110 may have any suitable bus architecture and may include any number of combination of buses.

A processor 114 is coupled to the bus 112. The processor 114 may include any suitable processing device or system, including a microprocessor (e.g., a single core or a multi-core processor), a network processor, an application specific integrated circuit (ASIC), or a field programmable gate array (FPGA), or any similar device. It should be noted that although FIG. 10 shows a single processor 114, the computer system 110 may include two or more processors.

The computer system 110 further includes system memory 116 coupled to the bus 112. The system memory 116 may include any suitable type and number of memories, such as static random access memory (SRAM), dynamic random access memory (DRAM), synchronous dynamic random access memory (SDRAM), or double data rate DRAM (DDRDRAM). During operation of the computer system 110, an operating system and other applications may be resident in the system memory 116.

The computer system 110 may further include a read-only memory (ROM) 118 coupled to the bus 112. The ROM 118 may store instructions for the processor 114. The computer system 110 may also include a storage device (or devices) 120 coupled to the bus 112. The storage device 120 includes any suitable non-volatile memory, such as, for example, a hard disk drive. The operating system and other programs may be stored in the storage device 120. Further, a device 122 for accessing removable storage media (e.g., a floppy disk drive or a CD ROM drive) may be coupled to the bus 112.

The computer system 110 may also include one or more Input/Output (I/O) devices 124 coupled to the bus 112. Common input devices include keyboards, pointing devices such as a mouse, as well as other data entry devices. Further, common output devices include video displays, printing devices, and audio output devices. It will be appreciated that these are but a few examples of the types of I/O devices that may be coupled to the computer system 110.

The computer system 110 may further comprise a network interface 126 coupled to the bus 112. The network interface 126 comprises any suitable hardware, software, or combination of hardware and software that is capable of coupling the system 110 with a network (e.g., a network interface card). The network interface 126 may establish a link with the network over any suitable medium (e.g., wireless, copper wire, fiber optic, or a combination thereof) supporting exchange of information via any suitable protocol such as TCP/IP (Transmission Control protocol/Internet Protocol), HTTP (Hyper-Text Transmission Protocol, as well as others.

It should be understood that the computer system 110 illustrated in FIG. 10 is intended to represent an embodiment of such a system and, further, that this system may include any additional components, which have been omitted for clarity and ease of understanding. By way of example, the system 110 may include a direct memory access (DMA) controller, a chip set associated with the processor 114, additional memory (e.g., cache memory) as well as additional signal lines and buses. Also, it should be understood that the computer system 110 may not include all the components shown in FIG. 7. The computer system 110 may comprise any type of computing device, such as a desktop computer, a laptop computer, a server, a hand-held computing device, a wireless communication device, an entertainment system etc.

In this embodiment, the computer system 110 may include the microelectronic package as described in the embodiments above. By way of example, the processor 114 may include a substrate having a plurality of solder bumps disposed on a top side of the substrate and a die disposed adjacent to the top side of the substrate. Further, the die may include a plurality of glassy metal bumps disposed on a bottom side of the die wherein the plurality of glassy metal bumps are to melt the plurality of solder bumps to form a liquid solder layer, wherein the liquid solder layer is to attach the die with the substrate.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

The invention claimed is:

1. A method of forming a microelectronic package, comprising:
    providing a substrate having a plurality of solder bumps on a top side of the substrate;
    disposing a die adjacent to the top side of the substrate;
    forming a plurality of glassy metal bumps on a bottom side of the die, wherein each of the plurality of glassy metal bumps is to contact with a corresponding solder bump on the substrate;
    crystallizing the plurality of glassy metal bumps to melt the plurality of solder bumps and form a liquid solder layer, wherein the liquid solder layer attaches the die with the substrate.

2. The method of claim 1, further comprising attaching the die to the substrate at a pre-determined temperature to crystallize the plurality of glassy metal bumps.

3. The method of claim 2, wherein the pre-determined temperature is greater than a glass transition temperature of the plurality of glassy metal bumps.

4. The method of claim 1, further comprising disposing an insulating layer between adjacent glassy metal bumps.

5. The method of claim 4, further comprising disposing a wettable metal on each of the plurality of glassy metal bumps.

6. The method of claim 5, further comprising disposing a noble metal on the wettable metal.

7. A method of forming a microelectronic package, comprising:
    forming a plurality of glassy metal bumps on a bottom side of a die;
    disposing the die adjacent to the top side of a substrate, wherein the a substrate includes a plurality of solder bumps on a top side thereof;
    contacting the plurality of glassy metal bumps to the plurality of solder bumps; and
    crystallizing the plurality of glassy metal bumps to melt the plurality of solder bumps and form a liquid solder layer, wherein the liquid solder layer attaches the die with the substrate.

8. The method of claim 7, wherein forming the plurality of glassy metal bumps includes chemical-mechanical polishing of a glassy metal layer that is imprinted over a patterned insulation layer.

9. The method of claim 7, further including:
    photoresist patterning and etching an insulation layer to form a patterned insulation layer;

chemical-mechanical polishing of a glassy metal layer that is imprinted over the patterned insulation layer to form the plurality of glassy metal bumps.

10. The method of claim 7, further comprising attaching the die to the substrate at a pre-determined temperature to crystallize the plurality of glassy metal bumps.

11. The method of claim 10, wherein the pre-determined temperature is greater than a glass transition temperature of the plurality of glassy metal bumps.

12. The method of claim 7, further comprising disposing an insulating layer between adjacent glassy metal bumps.

13. The method of claim 12, further comprising disposing a wettable metal on each of the plurality of glassy metal bumps.

14. The method of claim 13, further comprising disposing a noble metal on the wettable metal.

15. The method of claim 7, wherein forming the plurality of glassy metal bumps includes forming a layer of $Au_{49.2}Cu_{27}Ag_{5.5}Pd_{2.35}Si_{16}$.

16. The method of claim 7, wherein forming the plurality of glassy metal bumps includes forming a layer of $Au_{49.2}Cu_{27}Ag_{5.5}Pd_{2.35}Si_{16}$, the method further including disposing a copper wettable metal on each of the plurality of glassy metal bumps.

17. A method of forming a microelectronic package, comprising:

imprinting a glassy metal layer upon a die under pressure to cause superplastic deformation and to fill a pattern that results in a plurality of glassy metal bumps on a bottom side of the die;

disposing the die adjacent to the top side of a substrate, wherein the substrate includes a plurality of solder bumps on a top side thereof;

contacting the plurality of glassy metal bumps to the plurality of solder bumps; and crystallizing the plurality of glassy metal bumps to melt the plurality of solder bumps and form a liquid solder layer, wherein the liquid solder layer attaches the die with the substrate.

18. The method of claim 17, further comprising disposing a wettable metal on each of the plurality of glassy metal bumps.

19. The method of claim 18, further comprising disposing a noble metal on the wettable metal.

20. The method of claim 17, wherein the plurality of glassy metal bumps includes $Au_{49.2}Cu_{27}Ag_{5.5}Pd_{2.35}Si_{16}$.

21. The method of claim 17, wherein the plurality of glassy metal bumps includes $Mg_{54}Cu_{28}Ag_7Y_{11}$.

22. The method of claim 17, wherein the plurality of glassy metal bumps includes $La_{57.6}Al_{17.5}Cu_{12.45}Ni_{12.45}$.

23. The method of claim 17, wherein the plurality of glassy metal bumps includes $Au_{49.2}Cu_{27}Ag_{5.5}Pd_{2.35}Si_{16}$, the method further including disposing a copper wettable metal on each of the plurality of glassy metal bumps.

* * * * *